United States Patent
Lee et al.

(10) Patent No.: US 9,280,737 B2
(45) Date of Patent: Mar. 8, 2016

(54) SYSTEM IN PACKAGE STRUCTURE, ELECTROPLATING MODULE THEREOF AND MEMORY STORAGE DEVICE

(71) Applicant: PHISON ELECTRONICS CORP., Miaoli (TW)

(72) Inventors: Chun-Feng Lee, Hsinchu (TW); Chien-Liang Chang, Hsinchu County (TW); Hsuan-Teng Cheng, Kaohsiung (TW)

(73) Assignee: PHISON ELECTRONICS CORP., Miaoli (TW)

( * ) Notice: Subject to any disclaimer, the term of this patent is extended or adjusted under 35 U.S.C. 154(b) by 71 days.

(21) Appl. No.: 14/463,672

(22) Filed: Aug. 20, 2014

(65) Prior Publication Data

US 2015/0379389 A1    Dec. 31, 2015

(30) Foreign Application Priority Data

Jun. 25, 2014    (TW) .............................. 103121913 A

(51) Int. Cl.

| | |
|---|---|
| H01L 23/49 | (2006.01) |
| G06K 19/077 | (2006.01) |
| G11C 16/04 | (2006.01) |
| G11C 5/04 | (2006.01) |
| G11C 5/06 | (2006.01) |
| C25D 17/00 | (2006.01) |
| H01L 23/498 | (2006.01) |
| H01L 23/522 | (2006.01) |
| H01L 25/065 | (2006.01) |

(52) U.S. Cl.
CPC ........ G06K 19/07732 (2013.01); C25D 17/007 (2013.01); G06K 19/07722 (2013.01); G11C 5/04 (2013.01); G11C 5/06 (2013.01); G11C 16/04 (2013.01); H01L 23/49 (2013.01); H01L 23/49811 (2013.01); H01L 23/5223 (2013.01); H01L 25/0655 (2013.01)

(58) Field of Classification Search
CPC combination set(s) only.
See application file for complete search history.

(56) References Cited

U.S. PATENT DOCUMENTS

| | | | | |
|---|---|---|---|---|
| 2001/0026022 | A1* | 10/2001 | Schoenfeld | H01L 23/52 257/784 |
| 2005/0045987 | A1* | 3/2005 | Koo | H01L 23/645 257/531 |
| 2007/0218728 | A1* | 9/2007 | Jow | G06K 19/07732 439/159 |
| 2010/0171211 | A1* | 7/2010 | Jao | H01L 23/50 257/690 |
| 2012/0025898 | A1* | 2/2012 | Chen | H01L 23/50 327/524 |

* cited by examiner

Primary Examiner — Stephen W Smoot
(74) Attorney, Agent, or Firm — Jianq Chyun IP Office

(57) ABSTRACT

A system in package (SIP) structure, an electroplating module thereof and a memory storage device are provided. The SIP structure includes a first layout layer, a second layout layer and a rewritable non-volatile memory module. The first layout layer includes a first pad and a wire. The first pad is close to a first side of the first layout layer, and the first pad is configured to couple to a ground voltage. One terminal of the wire is coupled to the first pad, and another terminal of the wire is coupled to an opening of the SIP structure, wherein the opening is located at a second side of the first layout layer opposite to the first side, and the opening is configured to couple to an external voltage.

18 Claims, 5 Drawing Sheets

US 9,280,737 B2

SYSTEM IN PACKAGE STRUCTURE, ELECTROPLATING MODULE THEREOF AND MEMORY STORAGE DEVICE

CROSS-REFERENCE TO RELATED APPLICATION

This application claims the priority benefit of Taiwan application serial no. 103121913, filed on Jun. 25, 2014. The entirety of the above-mentioned patent application is hereby incorporated by reference herein and made a part of this specification.

BACKGROUND

1. Technical Field

The invention relates to a package structure, and more particularly, relates to a system in package (SIP) structure, an electroplating module thereof and a memory storage device.

2. Description of Related Art

The markets of digital cameras, cellular phones, and MP3 players have expanded rapidly in recent years, resulting in escalated demand for storage media by consumers. The characteristics of data non-volatility, low power consumption, and compact size make a rewritable non-volatile memory module (e.g., flash memory) ideal to be built in the portable multi-media devices as cited above.

Generally, during production stage, a plurality of SD cards are mounted on one supporting bracket, so that an electroplating process may be simultaneously performed on these SD cards. However, after the SD cards are cut from the supporting bracket, each of the SD cards may include one or more openings which are conductive. Accordingly, when users plug said SD cards, electro static introduced by these openings may cause interferences to the SD cards.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

The invention is directed to a system in package (SIP) structure, an electroplating module thereof and a memory storage device, and capable of reducing an electro static discharge (ESD) interference.

An exemplary embodiment of the invention provides a SIP structure, which includes a first layout layer, a second layout layer and a rewritable non-volatile memory module. The first layout layer includes a first pad and a wire. The first pad is close to a first side of the first layout layer, and the first pad is configured to couple to a ground voltage. One terminal of the wire is coupled to the first pad, and another terminal of the wire is coupled to an opening of the SIP structure, wherein the opening is located at a second side of the first layout layer opposite to the first side, and the opening is configured to couple to an external voltage. The second layout layer is disposed opposite to the first layout layer. The rewritable non-volatile memory module is disposed on the first layout layer or the second layout layer.

An exemplary embodiment of the invention provides a memory storage device, which includes a SIP structure and a rewritable non-volatile memory module. The SIP structure includes a first layout layer and a second layout layer. The first layout layer includes a first pad and a wire. The first pad is close to a first side of the first layout layer, and the first pad is configured to couple to a ground voltage. One terminal of the wire is coupled to the first pad, and another terminal of the wire is coupled to an opening of the SIP structure, wherein the opening is located at a second side of the first layout layer opposite to the first side, and the opening is configured to couple to an external voltage. The second layout layer is disposed opposite to the first layout layer. The rewritable non-volatile memory module is disposed on the first layout layer or the second layout layer.

An exemplary embodiment of the invention provides an electroplating module of SIP structure, which includes a supporting bracket and a plurality of SIP structures. The supporting bracket has a plurality of connection points. Each of the SIP structures includes a first layout layer, a second layout layer and a rewritable non-volatile memory module. The first layout layer includes a first pad and a wire. The first pad is close to a first side of the first layout layer, and the first pad is configured to couple to a ground voltage. One terminal of the wire is coupled to the first pad, and another terminal of the wire is coupled to an opening of the SIP structure, wherein the opening is located at a second side of the first layout layer opposite to the first side, and the opening is coupled to one of the connection points. The second layout layer is disposed opposite to the first layout layer. The rewritable non-volatile memory module is disposed on the first layout layer or the second layout layer.

Based on above, by disposing one wire between the opening of the SIP structure and the pad configured to couple to the ground voltage, the electrostatic noise introduced from the opening may be released during use of the SIP structure or the memory storage device, so as to reduce the electro static discharge interference.

To make the above features and advantages of the disclosure more comprehensible, several embodiments accompanied with drawings are described in detail as follows.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
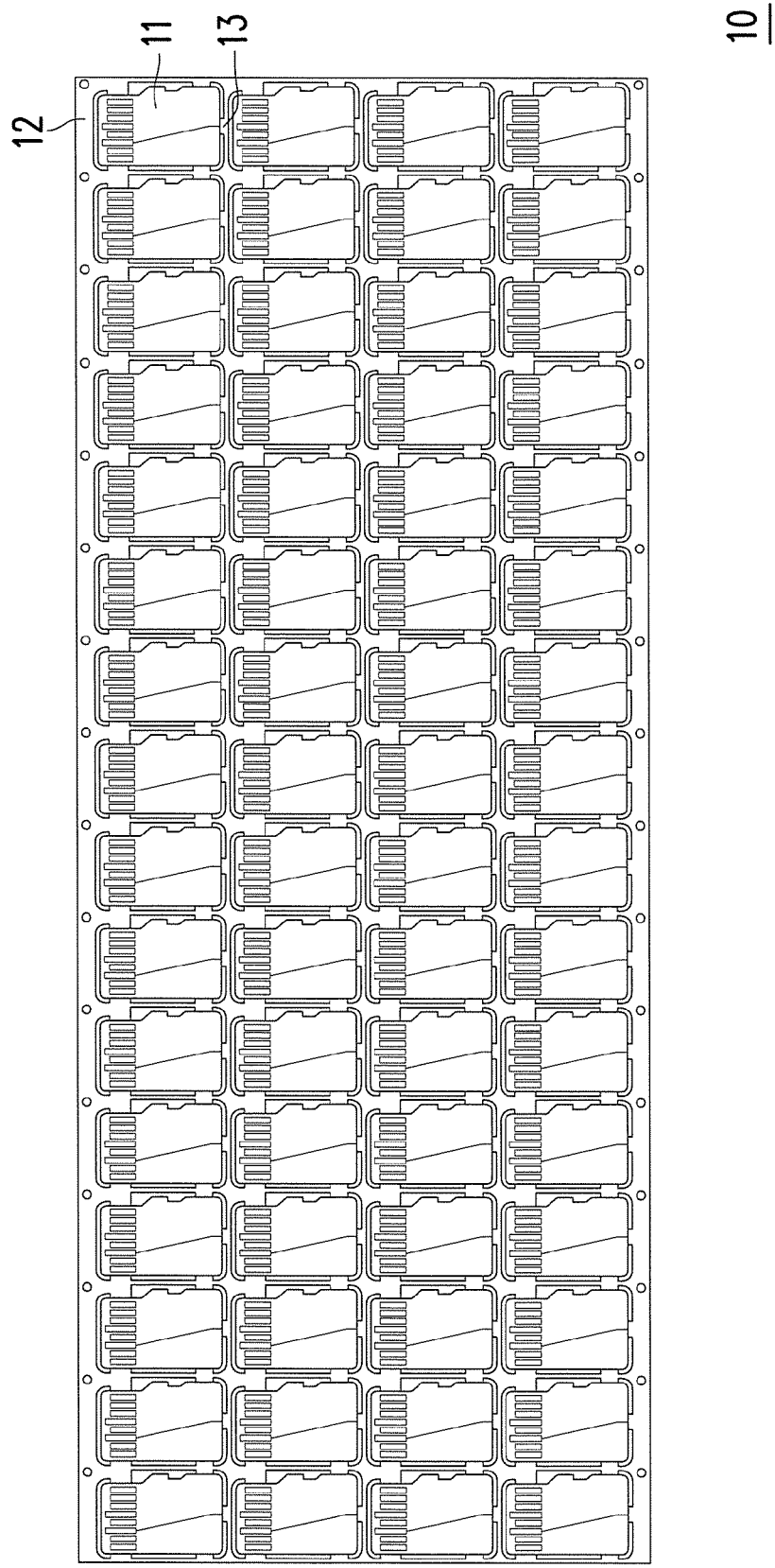
FIG. 1 is a schematic diagram illustrating an electroplating module of system in package (SIP) structure according to an exemplary embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least one of A,B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

Exemplary embodiments are provided below to describe the invention in detail, though the invention is not limited to the provided exemplary embodiments, and the provided exemplary embodiments can be suitably combined. The term "coupling/coupled" used in this specification (including claims) may refer to any direct or indirect connection means. For example, "a first device (or a first unit, a first component) is coupled to a second device (or a second unit, a second component)" should be interpreted as "the first device is directly connected to the second device" or "the first device is indirectly connected to the second device through other devices or connection means." In addition, the term "signal" can mean a current, a voltage, a charge, a temperature, data or any one or multiple signals.

FIG. 1 is a schematic diagram illustrating an electroplating module of system in package (SIP) structure according to an exemplary embodiment of the invention.

Referring to FIG. 1, an electroplating module 10 of SIP structure includes a plurality of SIP structures 11 and a supporting bracket 12. In the present exemplary embodiment, process conditions (e.g., materials and/or circuit layouts) of each of the SIP structures 11 in the electroplating module 10 of SIP structure are the same. In another exemplary embodiment, process conditions of parts of the SIP structures 11 in the electroplating module 10 of SIP structure may be different. One SIP structure 11 may include one or more chips.

In the present exemplary embodiment, each of the SIP structures 11 is included in a rewritable non-volatile memory storage device. Alternatively, each of the SIP structures 11 may be regarded as one rewritable non-volatile memory storage device. Each of the SIP structures 11 includes one or more rewritable non-volatile memory modules. Alternatively, each of the SIP structures 11 may be coupled to one or more rewritable non-volatile memory modules. One rewritable non-volatile memory module has a plurality of physical erasing units (not illustrated). Each of the physical erasing units may belong to the same memory die or belong to different memory dies. Each physical erasing unit has a plurality of physical programming units, and the physical programming units of the same physical erasing unit may be written separately and erased simultaneously. For example, one physical erasing unit is composed of 128 physical programming units. Nevertheless, it should be understood that the invention is not limited thereto. Each physical erasing unit is composed by 64 physical programming units, 256 physical programming units or any amount of the physical programming units. The rewritable non-volatile memory module as mentioned herein is not marked in the drawing because it is packaged inside the SIP structure 11. Based on above description, persons with ordinary skill in the art (or technicians) should be able to understand what the rewritable non-volatile memory module is. For example, the rewritable non-volatile memory storage device may be the SD card, the micro SD card, the MMC card, the CF card or an embedded storage device. The embedded storage device includes an embedded MMC (eMMC). Nonetheless, a dimension or a size of each of the SIP structures 11 is not particularly limited in the present invention. In addition, the SIP structure 11 may also include various electronic components such as a resistor, a capacitor, a connector, an antenna, a micro-processor, a micro-controller and so on, and these electronic components may be installed on the same substrate or on different substrates.

In the present exemplary embodiment, the electroplating module 10 of SIP structure includes 64 (4×16) SIP structures 11. Each of the SIP structures 11 is coupled to the supporting bracket 12 through 5 connection points (e.g., a connection point 13). Accordingly, by applying an external voltage to the supporting bracket 12, the external voltage may be provided to each of the SIP structures 11 through the connection points, so that an electroplating process may be performed on each of the SIP structures 11. However, in another exemplary embodiment, the electroplating module 10 of SIP structure may include more or less SIP structures, and/or a number of the connection points for coupling each of the SIP structures with the supporting bracket 12 may be more or less, which are not limited in the invention. After the electroplating process is completed, each of the SIP structures 11 is cut from the electroplating module 10 of SIP structure.

Figure 2:
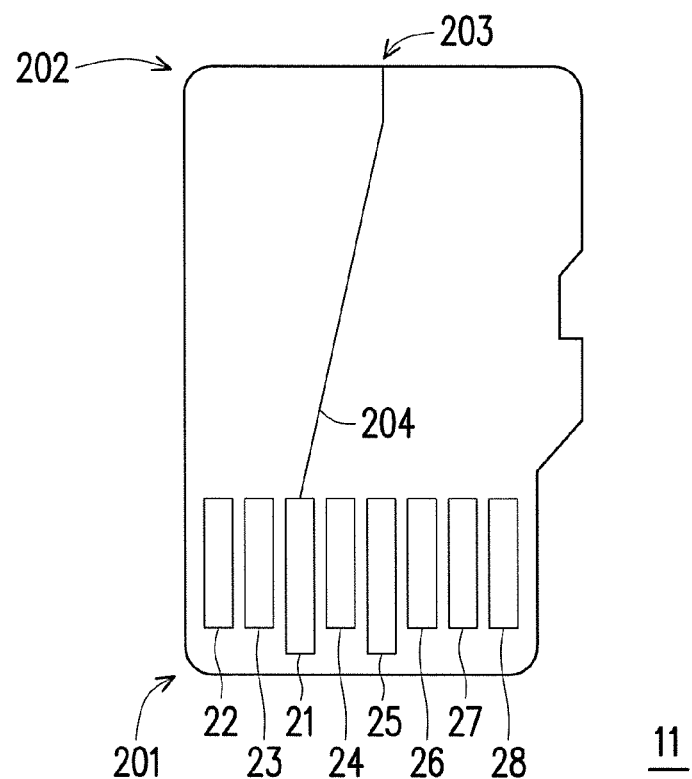
FIG. 2 and FIG. 3 are schematic diagrams illustrating a SIP structure according to an exemplary embodiment of the invention.
Figure 3:
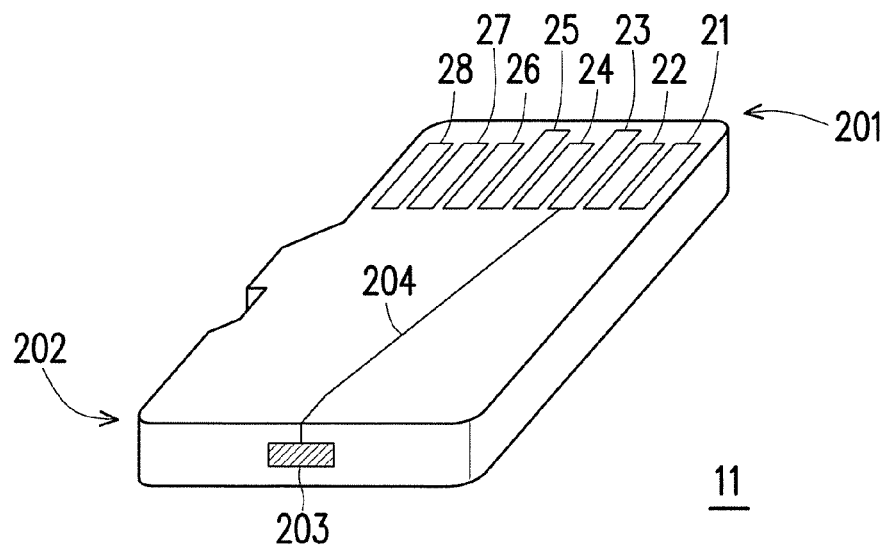

FIG. 2 and FIG. 3 are schematic diagrams illustrating a SIP structure according to an exemplary embodiment of the invention.

Referring to FIG. 2 and FIG. 3 together, one SIP structure 11 includes a plurality of layers (also known as layout layers). For example, in the present exemplary embodiment, the SIP structure 11 includes two layout layers, and an adhesion layer (not illustrated) may also be included between the two layout layers. However, in another exemplary embodiment, a number of the layout layers may be more or less, which is not particularly limited in the invention.

The SIP structure 11 at least includes a pad 21 (also known as a first pad). The pad 21 is disposed on one layout layer (also known as a first layout layer) of the SIP structure 11. Another layout layer (also known as a second layout layer) of the SIP structure 11 is disposed opposite to the first layout layer. For example, as shown in FIG. 3, the first layout layer where the pad 21 is located is disposed above the second layout layer. A material of the pad 21 may be any conductive metals or conductive non-metals. The SIP structure 11 includes a side 201 (also known as a first side) and a side 202 (also known as a second side) opposite to the side 201. A position where the pad 21 is disposed is close to the side 201 and respectively far from the side 202. In addition, the rewritable non-volatile memory module in the SIP structure 11 may be disposed on the first layout layer or the second layout layer, which is not particularly limited in the invention.

The SIP structure 11 may be coupled to a host system to communicate with the host system (e.g., data transmission). When the SIP structure 11 is coupled to the host system, a portion where the side 201 is located is inserted into a slot of the host system, and only a portion where the side 202 is located is exposed. After the portion wherein the side 201 is located is inserted into the slot of the host system, the pad 21 is coupled to an electrode in the slot to couple to a ground voltage (e.g., a ground voltage VSS). In addition, the exposed portion where the side 202 is located may serve as a point of force for pulling the SIP structure 11 out from the slot.

In an exemplary embodiment, the SIP structure 11 further includes pads 22 to 28 (also known as second pads). As shown in FIG. 2 and FIG. 3, the pads 22 to 28 are disposed on the first layout layer in parallel to the pad 21. Similarly, positions where the pads 22 to 28 are disposed are close to the side 201 and respectively far from the side 202. After the portion where the side 201 is located is inserted into the slot of the host system, each of the pads 22 to 28 is coupled to an corresponding electrode in the slot, so as to receive an operating voltage (e.g., a voltage VDD) or a clock signal, transmit commands, or perform data transmission with the host system. A number of the pads 22 to 28 may be more or less, which is not particularly limited in the invention.

It should be noted that, after one SIP structure 11 is cut from the electroplating module 10 of SIP structure, at least one opening (also known as an electroplating opening) corresponding to the connection point where the SIP structure 11 is originally coupled to the supporting bracket 12 is included on the SIP structure 11. One opening is corresponding to one connection point. Taking the connection point 13 of FIG. 1 as an example, an opening 203 corresponding to the connection point 13 is at least included on the SIP structure 11 of FIG. 2 and FIG. 3. When the SIP structure 11 is not yet cut from the supporting bracket 12, the supporting bracket 12 may provide the external voltage to the SIP structure 11 through the connection point 13 and the opening 203. In other words, the opening 203 may receive the external voltage for the electroplating process through the connection point 13. The opening 203 is located at the side 202. After the portion where the side 201 is located is inserted into the slot of the host system, since the side 202 is exposed outside the slot, when human body or other conductive objects are close to or touched on the opening 203 (e.g., attempting to pull the SIP structure 11 out from the slot), a noise such as electro static may be generated at the opening 203 to thereby interference the electronic components in the SIP structure 11. For example, an electro static discharge (ESD) interference may be generated. For example, such noise may cause errors in reading data, or may damage the operating electronic components in the SIP structure 11.

In the present exemplary embodiment, one or more wires 204 are disposed on the first layout layer of the SIP structure 11. Herein, one wire 204 is taken as an example. One terminal of the wire 204 is coupled to the pad 21. Another terminal of the wire 204 is coupled to the opening 203. When noise such as electro static is generated at the opening 203, the noise may be conducted to the pad 21, and released to the host system. Accordingly, influences of the noise to the operating electronic components in the SIP structure 11 may be reduced.

In an exemplary embodiment, the wire 204 may be replaced by a plurality of wires which are serial connected to one another.

Figure 4:
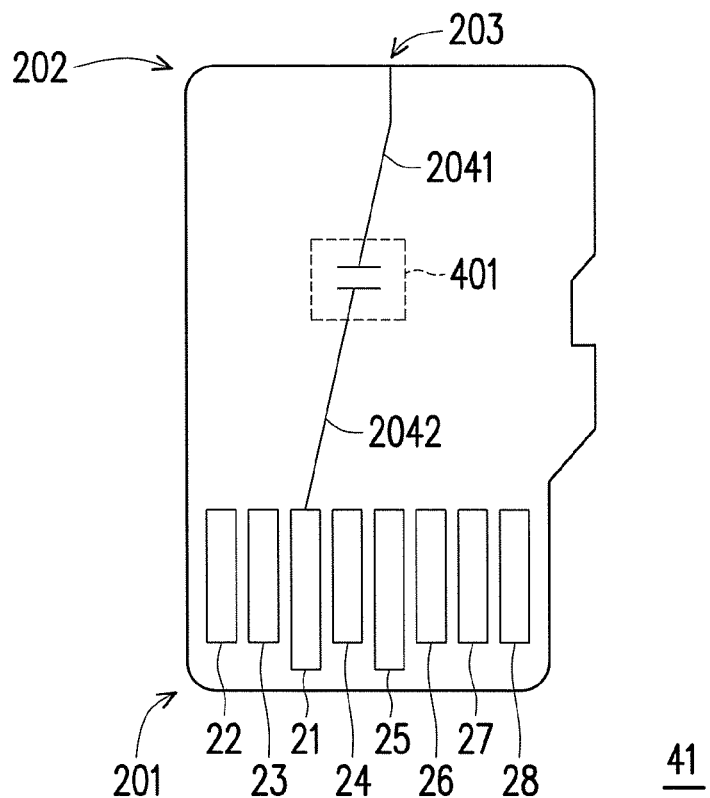
FIG. 4 is a schematic diagram illustrating a SIP structure according to another exemplary embodiment of the invention.

FIG. 4 is a schematic diagram illustrating a SIP structure according to another exemplary embodiment of the invention.

Referring to FIG. 4, a difference between a SIP structure 41 and the SIP structure 11 is that, the SIP structure 41 includes a wire 2041, a wire 2042 and a capacitor unit 401. The wire 2041 is also known as a first wire, and the wire 2042 is also known as a second wire. One terminal of the wire 2041 is coupled to the opening 203, and another terminal of the wire 2041 is coupled to one terminal (also known as an input terminal) of the capacitor unit 401. Another terminal (also known as an output terminal) of the capacitor unit 401 is coupled to one terminal of the wire 2042, and another terminal of the wire 2042 is coupled to the pad 21. In the present exemplary embodiment, the capacitor unit 401 includes one or more capacitors. In another exemplary embodiment, the capacitor units 401 may further include any circuit elements for buffering the noise. Accordingly, a stability of the SIP structure 41 for releasing noise may be enhanced.

In an exemplary embodiment, the capacitor unit 401 may also be parallel connected to another wire.

Figure 5:
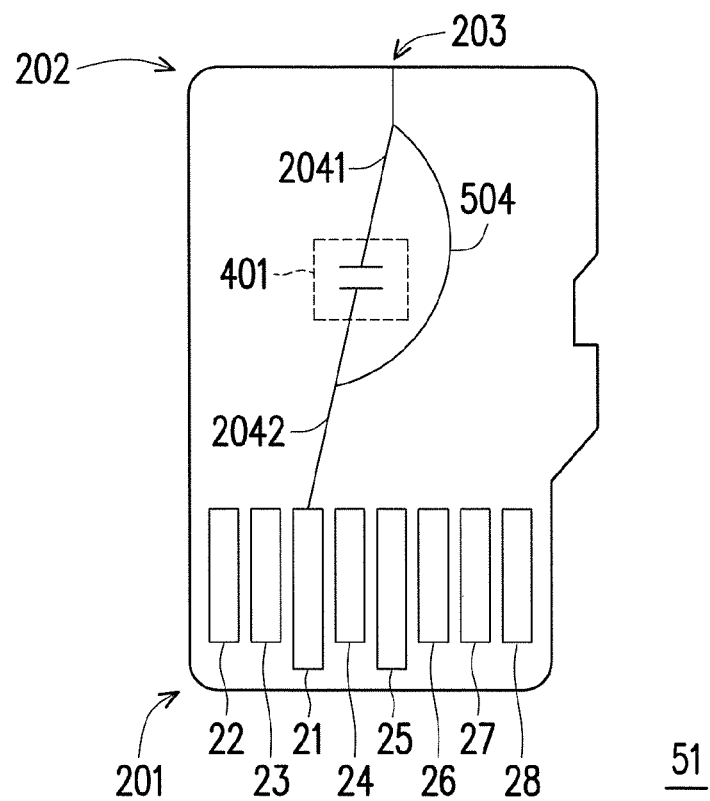
FIG. 5 is a schematic diagram illustrating a SIP structure according to another exemplary embodiment of the invention.

FIG. 5 is a schematic diagram illustrating a SIP structure according to another exemplary embodiment of the invention.

Referring to FIG. 5, a difference between a SIP structure 51 and the SIP structure 41 is that, the SIP structure 51 further includes a wire 504. The wire 504 is also known as a third wire. One terminal of the wire 504 is coupled to the input terminal of the capacitor unit 401, and another terminal of the wire 504 is coupled to the output terminal of the capacitor unit 401. Accordingly, a stability of the SIP structure 51 for releasing noise may be further enhanced.

In an exemplary embodiment, a plurality of openings may be located at the first side of the SIP structure or two sides of the first side. Therefore, through another wire, these openings may be simultaneously coupled to the wire for releasing the noise.

Figure 6:
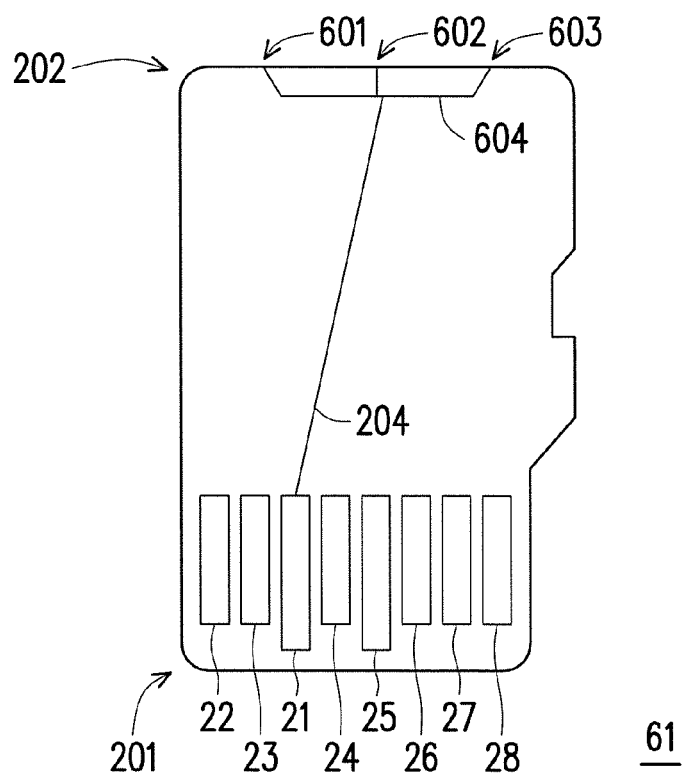
FIG. 6 and FIG. 7 are schematic diagrams illustrating a SIP structure according to another exemplary embodiment of the invention.
Figure 7:
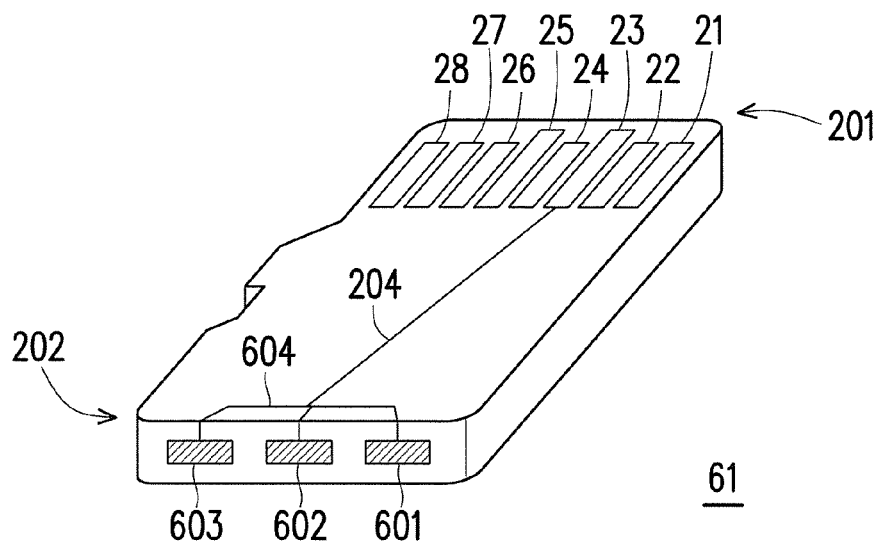

FIG. 6 and FIG. 7 are schematic diagrams illustrating a SIP structure according to another exemplary embodiment of the invention.

Referring to FIG. 6 and FIG. 7, a difference between a SIP structure 61 and the SIP structure 11 is that, the SIP structure 61 includes openings 601 to 603. A number of the openings 601 to 603 may be more or less, which is not particularly limited in the invention. In an exemplary embodiment, the opening 601 is also known as a first opening, the opening 602 is also known as a second opening, and the opening 603 is also known as a third opening. As similar to the SIP structure 11, when the SIP structure 61 is not yet separated from the corresponding supporting bracket, each of the openings 601 to 603 is coupled to one connection point on the supporting bracket. Accordingly, the supporting bracket is capable of providing the external voltage to the SIP structure 61 through the openings 601 to 603, so that the electroplating process may be performed on the SIP structure 61.

Unlike the SIP structure 11, the SIP structure 61 further includes a wire 604. The wire 604 is also known as a serial connected wire. The wire 604 is simultaneously coupled to the openings 601 to 603. In addition, the wire 604 is also coupled to the one terminal of the wire 204. Another terminal of the wire 204 is coupled to the pad 21. After the portion where the side 201 is located is inserted into the slot of the host system, when human body or other conductive objects are close to or touched on at least one of the openings 601 to 603 (e.g., attempting to pull the SIP structure 61 out from the slot), noise such as electro static generated at any one of the openings 601 to 603 may be released to the host system through the wires 604, 204 and the pad 21.

Figure 8:
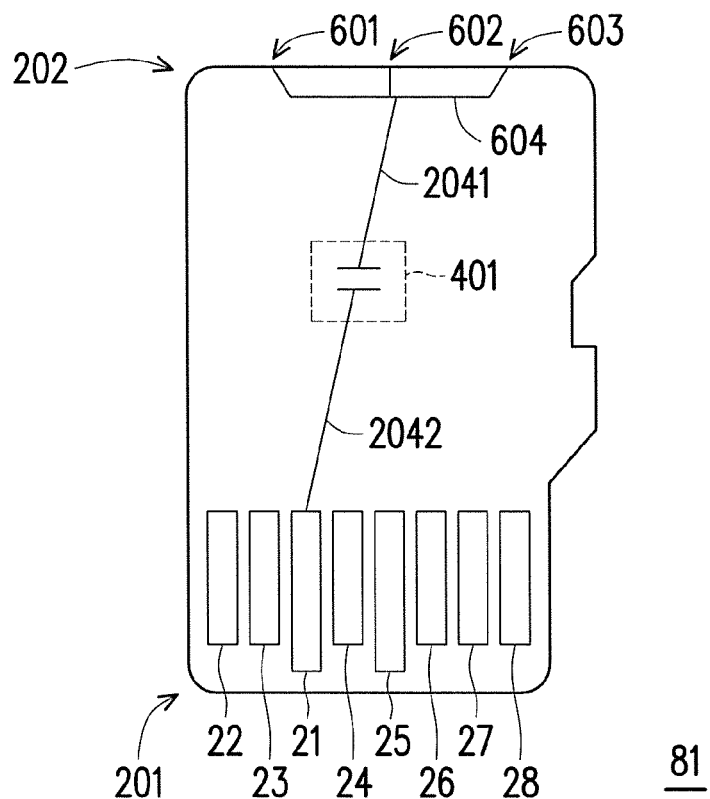
FIG. 8 is a schematic diagram illustrating a SIP structure according to another exemplary embodiment of the invention.

FIG. 8 is a schematic diagram illustrating a SIP structure according to another exemplary embodiment of the invention.

Referring to FIG. 8, the wire 2041, the wire 2042 and the capacitor unit 401 in FIG. 8 are identical or similar to the wire 2041, the wire 2042 and the capacitor unit 401 in FIG. 4, respectively, and thus related descriptions thereof are not repeated hereinafter. In a SIP structure 81, the one terminal of the wire 2041 is coupled to the wire 604, and the another terminal of the wire 2041 is coupled to the input terminal of the capacitor unit 401. The output terminal of the capacitor unit 401 is coupled to the one terminal of the wire 2042, and the another terminal of the wire 2042 is coupled to the pad 21. Accordingly, a stability of the SIP structure 81 for releasing noise may be enhanced.

Figure 9:
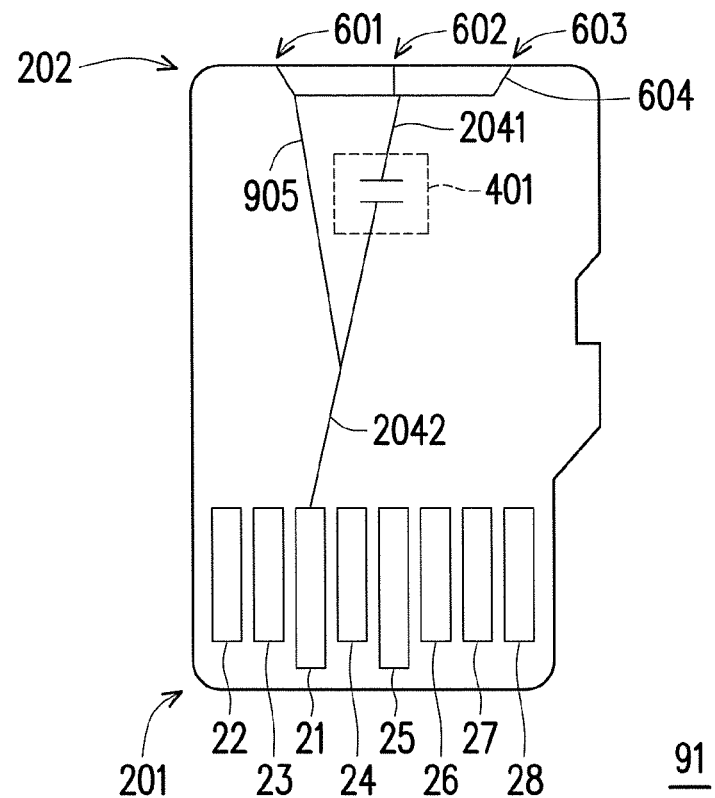
FIG. 9 is a schematic diagram illustrating a SIP structure according to another exemplary embodiment of the invention.

FIG. 9 is a schematic diagram illustrating a SIP structure according to another exemplary embodiment of the invention.

Referring to FIG. 9, a difference between a SIP structure 91 and the SIP structure 81 is that, the SIP structure 91 further includes a wire 905. The wire 905 is also known as the third wire. One terminal of the wire 905 is coupled to the input terminal of the capacitor unit 401, and another terminal of the wire 905 is coupled to the output terminal of the capacitor unit 401. Accordingly, a stability of the SIP structure 91 for releasing noise may be further enhanced.

It is worth mentioning that, in each of the foregoing exemplary embodiments, each of the mentioned wires (e.g., the wires 204, 2041, 2042 and 604) is disposed on the first layout layer of the corresponding SIP structure, and the first layout layer is a layer used for disposing the pads (e.g., the pads 21 to 28). However, in another exemplary embodiment, a portion or all of the mentioned wires may also be disposed on the second layout layer under the first layout layer, which are not particularly limited in the invention. In addition, in each of the foregoing exemplary embodiments, the wires (e.g., the wires 204, 2041, 2042 and 604) coupled between the opening (e.g., the openings 203 or 601 to 603) and the pad (e.g., the pad 21) are dedicated to release an electro static noise received by the openings instead of using for any other uses (e.g., transmitting commands or data signal). Furthermore, in an exemplary embodiment, a shortest path between the opening (e.g., the openings 2023 or 601 to 603) on the second side and the pad 21 is used for disposing aforesaid wires 204, 2041 and 2042, so as to improve a efficiency for releasing the electro static noise.

In summary, according to an exemplary embodiment, by disposing at least one wire between the electroplating opening of the SIP structure and the pad configured to couple to the ground voltage, the electro static noise introduced from the electroplating opening may be released during use of the SIP structure or the memory storage device, so as to reduce the electro static discharge interference.

The previously described exemplary embodiments of the present invention have the advantages aforementioned, wherein the advantages aforementioned not required in all versions of the invention.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A system in package (SIP) structure, comprising:
a first layout layer, comprising:
a first pad, close to a first side of the first layout layer, and configured to couple to a ground voltage; and
a wire, one terminal of the wire being coupled to the first pad, and another terminal of the wire being coupled to an opening of the SIP structure, wherein the opening is located at a second side of the first layout layer opposite to the first side, and the opening is configured to couple to an external voltage;
a second layout layer, disposed opposite to the first layout layer; and
a rewritable non-volatile memory module, disposed on the first layout layer or the second layout layer.

2. The SIP structure of claim 1, wherein the wire comprises a first wire and a second wire, one terminal of the first wire is coupled to the opening, another terminal of the first wire is coupled to an input terminal of a capacitor unit, an output terminal of the capacitor unit is coupled to one terminal of the second wire, and another terminal of the second wire is coupled to the first pad.

3. The SIP structure of claim 2, wherein the wire further comprises a third wire, one terminal of the third wire is coupled to the input terminal of the capacitor unit, and another terminal of the third wire is coupled to the output terminal of the capacitor unit.

4. The SIP structure of claim 1, wherein the opening is configured to connect to a supporting bracket, and the supporting bracket is configured to provide the external voltage to the SIP structure through the opening.

5. The SIP structure of claim 1, wherein the first layout layer further comprises at least one second pad, the at least one second pad is close to the first side of the first layout layer, and the first pad and the at least one second pad are configured to couple to a host system.

6. The SIP structure of claim 1, wherein the opening comprises a first opening and a second opening, the first layout layer further comprises a serial connected wire, and the wire is simultaneously coupled to the first opening and the second opening through the serial connected wire.

7. A memory storage device, comprising:
a system in package (SIP) structure, comprising:
a first layout layer, comprising:
a first pad, close to a first side of the first layout layer, and configured to couple to a ground voltage; and
a wire, one terminal of the wire being coupled to the first pad, and another terminal of the wire being coupled to an opening of the SIP structure, wherein the opening is located at a second side of the first layout layer opposite to the first side, and the opening is configured to couple to an external voltage; and
a second layout layer, disposed opposite to the first layout layer; and
a rewritable non-volatile memory module, disposed on the first layout layer or the second layout layer.

8. The memory storage device of claim 7, wherein the wire comprises a first wire and a second wire, one terminal of the first wire is coupled to the opening, another terminal of the first wire is coupled to an input terminal of a capacitor unit, an output terminal of the capacitor unit is coupled to one terminal of the second wire, and another terminal of the second wire is coupled to the first pad.

9. The memory storage device of claim 8, wherein the wire further comprises a third wire, one terminal of the third wire is coupled to the input terminal of the capacitor unit, and another terminal of the third wire is coupled to the output terminal of the capacitor unit.

10. The memory storage device of claim 7, wherein the opening is configured to connect to a supporting bracket, and the supporting bracket is configured to provide the external voltage to the SIP structure through the opening.

11. The memory storage device of claim 7, wherein the first layout layer further comprises at least one second pad, and the at least one second pad is close to the first side of the first layout layer, and the first pad and the at least one second pad are configured to couple to a host system.

12. The memory storage device of claim 7, wherein the opening comprises a first opening and a second opening, the first layout layer further comprises a serial connected wire, and the wire is simultaneously coupled to the first opening and the second opening through the serial connected wire.

13. An electroplating module of system in package (SIP) structure, comprising:
   a supporting bracket, having a plurality of connection points; and
   a plurality of SIP structures, each of the SIP structures comprising:
      a first layout layer, comprising:
         a first pad, close to a first side of the first layout layer, and configured to couple to a ground voltage; and
         a wire, one terminal of the wire being coupled to the first pad, and another terminal of the wire being coupled to an opening of the SIP structure, wherein the opening is located at a second side of the first layout layer opposite to the first side, and the opening is coupled to one of the connection points;
      a second layout layer, disposed opposite to the first layout layer; and
      a rewritable non-volatile memory module, disposed on the first layout layer or the second layout layer.

14. The electroplating module of SIP structure of claim 13, wherein the wire comprises a first wire and a second wire, one terminal of the first wire is coupled to the opening, another terminal of the first wire is coupled to an input terminal of a capacitor unit, an output terminal of the capacitor unit is coupled to one terminal of the second wire, and another terminal of the second wire is coupled to the first pad.

15. The electroplating module of SIP structure of claim 14, wherein the wire further comprises a third wire, one terminal of the third wire is coupled to the input terminal of the capacitor unit, and another terminal of the third wire is coupled to the output terminal of the capacitor unit.

16. The electroplating module of SIP structure of claim 13, wherein the supporting bracket is configured to provide an external voltage to the SIP structure through the opening.

17. The electroplating module of SIP structure of claim 13, wherein the first layout layer further comprises at least one second pad, the at least one second pad is close to the first side of the first layout layer, and the first pad and the at least one second pad are configured to couple to a host system.

18. The electroplating module of SIP structure of claim 13, wherein the opening comprises a first opening and a second opening, the first layout layer further comprises a serial connected wire, and the wire is simultaneously coupled to the first opening and the second opening through the serial connected wire.

* * * * *